United States Patent [19]

Markle

[11] Patent Number: 5,040,882
[45] Date of Patent: Aug. 20, 1991

[54] UNIT MAGNIFICATION OPTICAL SYSTEM WITH IMPROVED REFLECTIVE RETICLE

[75] Inventor: David A. Markle, Saratoga, Calif.

[73] Assignee: General Signal Corporation, Stamford, Conn.

[21] Appl. No.: 524,891

[22] Filed: May 18, 1990

Related U.S. Application Data

[63] Continuation-in-part of Ser. No. 267,965, Nov. 7, 1988, Pat. No. 4,964,705.

[51] Int. Cl.$^5$ ............................................. G02B 17/00
[52] U.S. Cl. .................................... 359/727; 355/43; 355/53; 359/732; 359/738
[58] Field of Search ............... 350/442, 446, 444, 448; 355/43, 53

[56] References Cited

U.S. PATENT DOCUMENTS

| | | |
|---|---|---|
| 1,401,345 | 12/1921 | Mechau . |
| 2,234,717 | 3/1941 | Altman et al. . |
| 2,742,817 | 4/1956 | Altman . |
| 3,536,380 | 10/1970 | Ferguson . |
| 3,748,015 | 7/1973 | Offner .................................. 350/55 |
| 3,915,546 | 4/1976 | Markle ................................ 355/133 |
| 3,917,399 | 11/1975 | Buzawa et al. ...................... 355/43 |
| 4,103,989 | 8/1978 | Rosin .................................. 350/199 |
| 4,171,870 | 10/1979 | Bruning et al. ..................... 350/173 |
| 4,171,871 | 10/1979 | Dill et al. ........................... 350/199 |
| 4,391,494 | 7/1983 | Hershel ............................... 350/442 |
| 4,425,037 | 1/1984 | Hershel et al. ..................... 355/43 |
| 4,444,492 | 4/1984 | Lee ..................................... 355/55 |
| 4,585,337 | 4/1986 | Philips ................................ 355/45 |
| 4,650,315 | 3/1987 | Markle ............................... 350/442 |
| 4,711,535 | 12/1987 | Shafer ................................. 350/442 |
| 4,714,307 | 12/1987 | Palmer ................................ 350/444 |
| 4,812,028 | 3/1989 | Matsumoto ......................... 350/442 |
| 4,964,705 | 10/1990 | Markle ................................ 350/442 |

OTHER PUBLICATIONS

0.3-Micron Optical Lithography Using a Phase-Shifting Mask—Tsuneo Terasawa, Norio Hasegawa, Toshiei Kurosaki and Toshihiko Tanaka.
New Phase Shifting Mask with Self-Aligned Phase Shifters for a Quarter Micron Photolighography—Akihiro Nitayama, Takashi Sato, Kohji Hashimoto, Fumiaki Shigemitsu and Makoto Nakase.

*Primary Examiner*—Bruce Y. Arnold
*Assistant Examiner*—Hung Xuan Dang
*Attorney, Agent, or Firm*—Milton E. Kleinman; Robert R. Hubbard

[57] ABSTRACT

An optical projection system has been provided which is particularly suited for use in microlithography and includes a source of exposure energy for generating a beam of energy. A primary lens and mirror are located in the path of the beam for receiving the beam and passing only a portion of the beam therethrough. A refractive lens group is located in the path of the portion of the beam for receiving and transmitting that portion. A recticle element is located in the path of the portion of the beam and has a uniform thickness having a pattern on one surface thereof and an unpatterned portion adjacent thereto. The reticle element is positioned for permitting the portion of the beam to pass through its thickness and for reflecting the portion of the beam back through its thickness and the refractive lens group to the primary lens and mirror. The primary lens and mirror is positioned to receive the reflected beam and includes a surface for reflecting a portion of the reflected beam back through the refractive lens group and the unpatterned portion on the reticle element to a surface to be imaged. The reticle element includes a transparent element having a predetermined uniform thickness and having two parallel planar surfaces separated by that thickness. The reticle pattern on one of the planar surfaces is made from a material having a high degree of reflectivity with respect to optical exposure energy. The reticle further includes a covering physically contacting the reticle pattern and completely covering that pattern. The covering has an index of refraction with respect to optical exposure energy which is sufficiently lower than the reticle index of refraction to cause a small portion of the exposure energy striking the covering to be reflected with insufficient intensity to expose photoresist on a wafer but with sufficient intensity and phase shift to improve edge control and resolution of the projected image formed by the reflected reticle pattern.

12 Claims, 7 Drawing Sheets

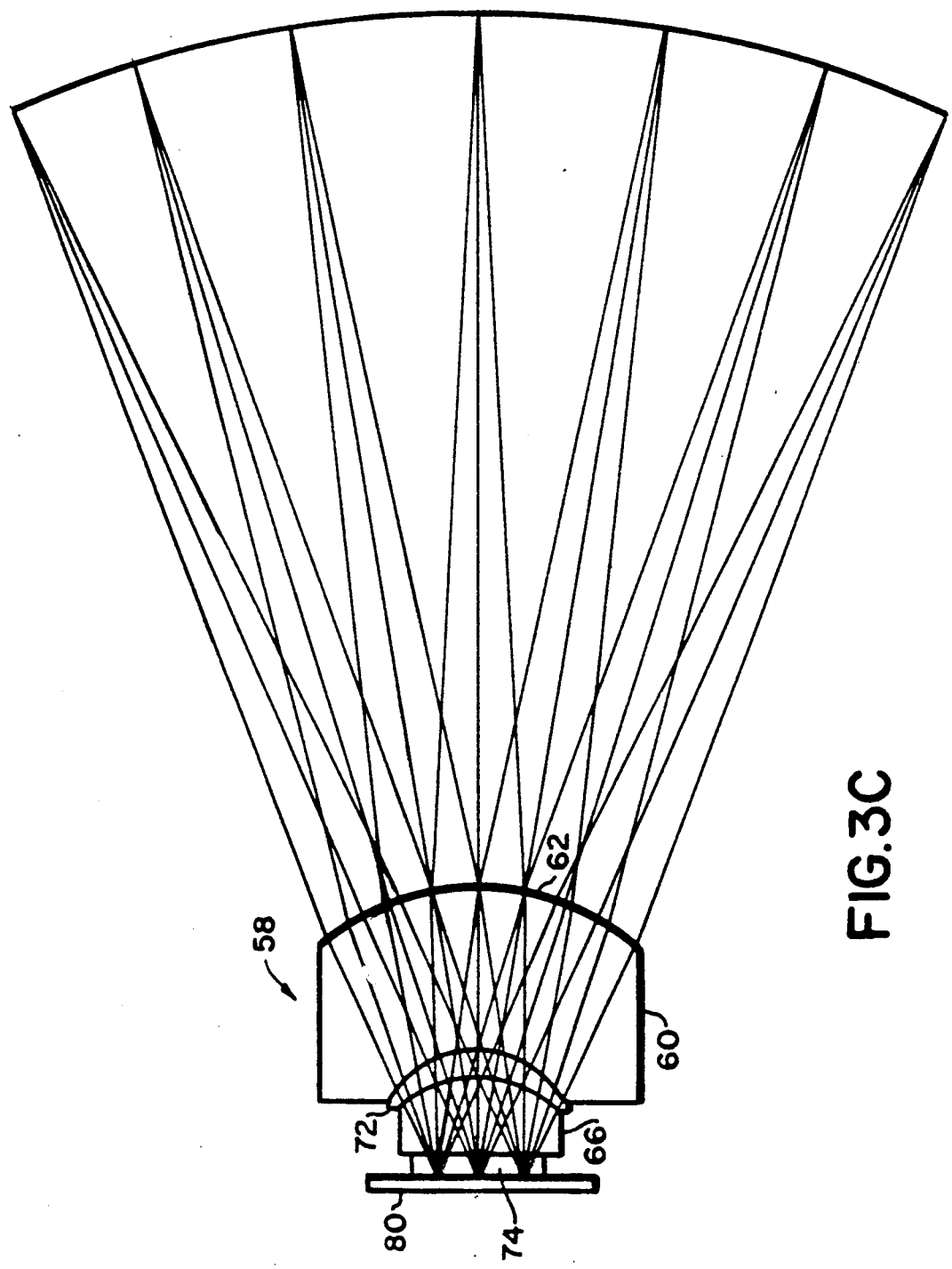

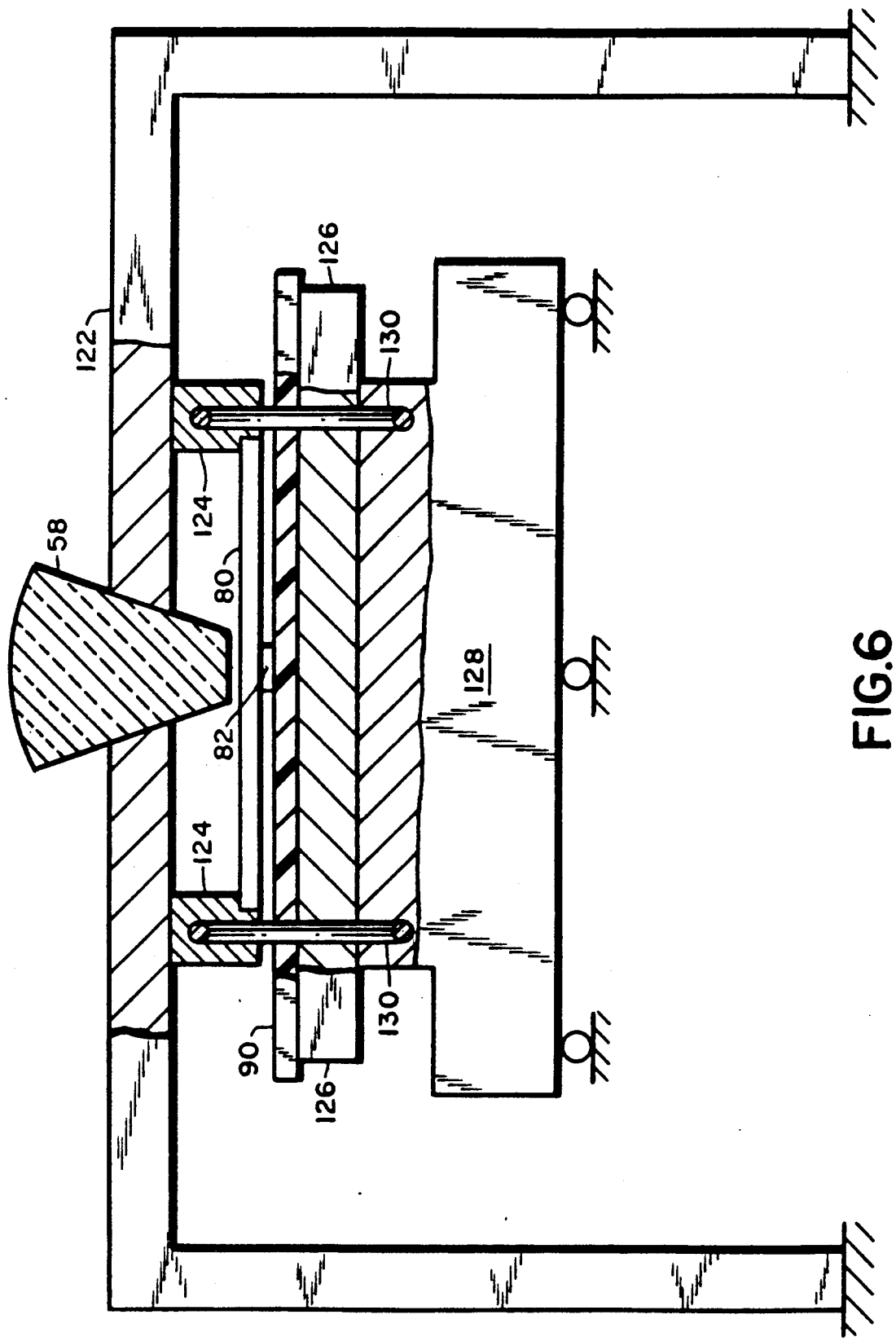

005,040,882

UNIT MAGNIFICATION OPTICAL SYSTEM WITH IMPROVED REFLECTIVE RETICLE

This application is a continuation-in-part of U.S. patent application Ser. No. 07/267,965 entitled "Unit Magnification Optical System", filed by David A. Markle on Nov. 7, 1988 and now U.S. Pat. No. 4,964,705 and assigned to the same assignee as the present invention.

TECHNICAL FIELD

This invention relates generally to an apparatus for microlithographically forming patterns on semiconductor wafers and more particularly to an improved system for one-to-one projection of pattern images on to a predetermined focal plane.

BACKGROUND OF THE INVENTION

The present invention is an improvement on the optical system described in U.S. Pat. No. 4,391,494, issued July 5, 1983, to Ronald S. Hershel and assigned to General Signal Corporation. The system described in the aforementioned patent is a unit magnification achromatic anastigmatic optical projection system that uses both reflective and refractive elements in a complementary fashion to achieve large field sizes and high numerical apertures. The system is basically symmetrical, thus eliminating all aberrations of odd order such as coma, distortion and lateral color. All of the spherical surfaces are nearly concentric with the centers of curvature located close to the focal plane. Thus the resultant system is essentially independent of the index of refraction of the air in the lens making pressure compensation unnecessary. However, in order to attain sufficient working space for movement of the reticle and wafer, the object and image planes of this system are separated through the use of two symmetrical folding prisms. The cost of this gain in working space is the reduction of available field size to about 25% to 35% of the total potential field. In the past, this reduction in field size has not been critical since it has been possible to obtain both acceptable field size and the degree of resolution required for state-of-the-art circuits However, with increasing demands for higher resolution capabilities from such systems, applicant has recognized a need to modify the system so that even higher numerical apertures and higher resolution may be obtained while maintaining acceptable field size.

SUMMARY OF THE INVENTION

Accordingly, an optical projection system has been provided which is particularly suited for use in microlithography and includes a source of exposure energy for generating a beam of energy. A primary lens and mirror is located in the path of the beam for receiving the beam and passing only a portion of the beam therethrough. A refractive lens group is located in the path of the portion of the beam for receiving and transmitting that portion. A reticle element is located in the path of the portion of the beam and has a uniform thickness having a pattern on one surface thereof and an unpatterned portion adjacent thereto. The reticle element is positioned for permitting the portion of the beam to pass through its thickness and for reflecting the portion of the beam back through its thickness and the refractive lens group to the primary lens and mirror. The primary lens and mirror is positioned to receive the reflected beam and includes a surface for reflecting a portion of the reflected beam back through the refractive lens group and the unpatterned portion on the reticle element to a surface to be imaged. The reticle element includes a transparent element having a predetermined uniform thickness and having two parallel planar surfaces separated by that thickness. The reticle pattern on one of the planar surfaces is made from a material having a high degree of reflectivity with respect to optical exposure energy. The reticle further includes a covering physically contacting the reticle pattern and completely covering that pattern. The covering has an index of refraction with respect to optical exposure energy which is sufficiently lower than the reticle index of refraction to cause a small portion of the exposure energy striking the covering to be reflected with insufficient intensity to expose photoresist on a wafer but with sufficient intensity and phase shift to improve edge control and resolution of the image formed by the reflected reticle pattern.

OBJECTS OF THE INVENTION

An object of the present invention is the provision of a unit magnification optical projection system particularly suited for use in microlithography which is capable of producing a large field size at high numerical apertures.

Another object of the present invention is the provision of a unit magnification optical projection system particularly suited for use in microlithography wherein the field size is nearly half of the total possible theoretical field size afforded by the numerical aperture of the system.

A further object of the present invention is the provision of a unit magnification optical projection system particularly suited for use in microlithography wherein the need for pellicles to protect the reticle from contaminants is eliminated.

Another object of the present invention is the provision of a unit magnification optical projection system particularly suited for use in microlithography which has both improved pattern edge control and pattern resolution.

Yet another object of the present invention is the provision of a unit magnification optical projection system particularly suited for use in microlithography which is both simple and inexpensive to manufacture.

Other objects, advantages, and novel features of the present invention will become apparent from the following detailed description of the invention when considered in conjunction with the accompanying drawings.

BRIEF DESCRIPTION OF THE DRAWINGS

FIG. 3C is a partial schematic view of a portion of a second embodiment of the projection optical system of the present invention.

FIG. 6 shows a schematic diagram of a suitable reticle stage and wafer chuck assembly for use with the optical system of the present invention.

DESCRIPTION OF THE PREFERRED EMBODIMENT

Figure 1:
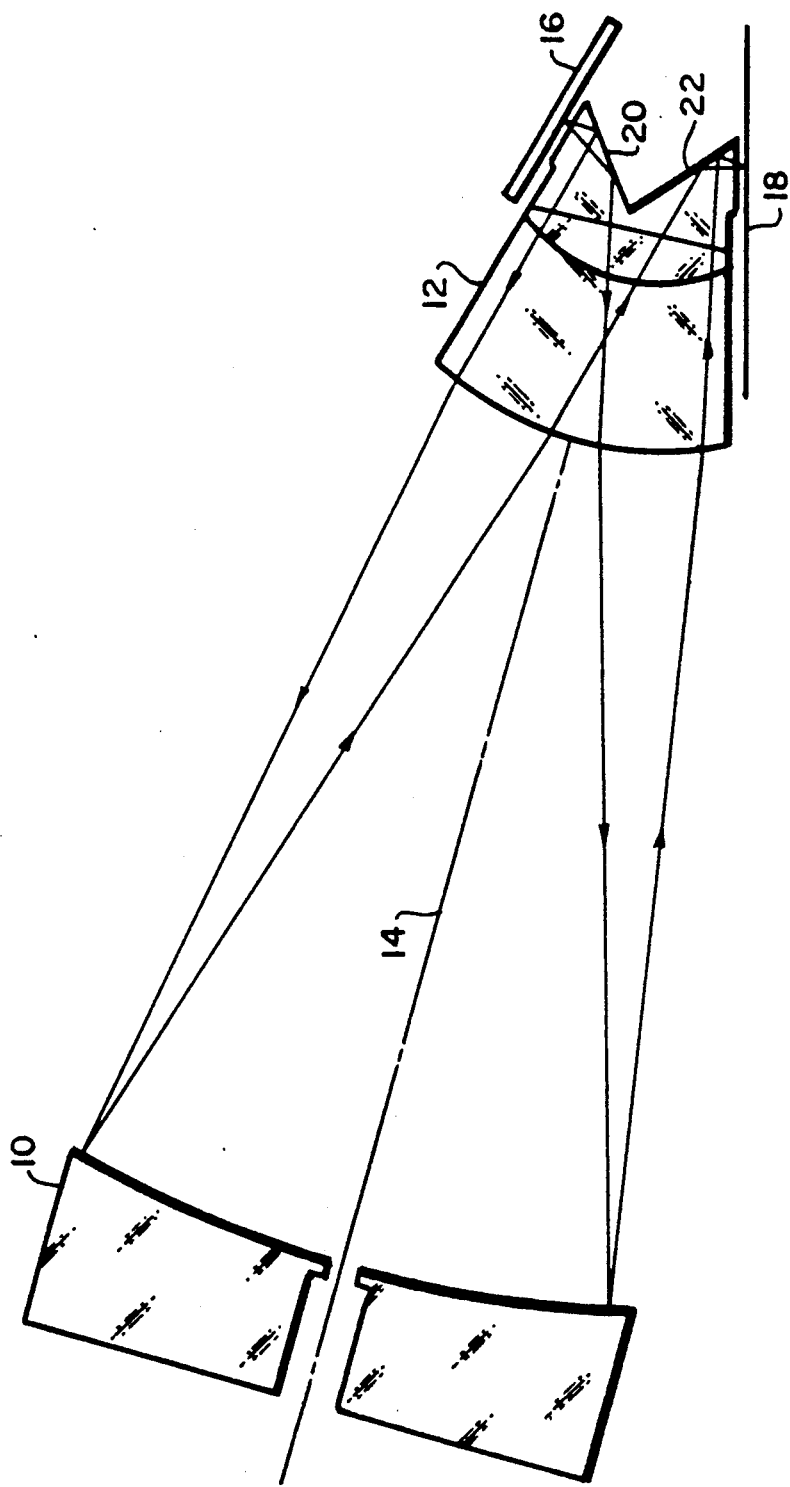
FIG. 1 is an optical schematic view of a known optical projection system of the type described in U.S. Pat. No. 4,391,494.
Figure 2A:
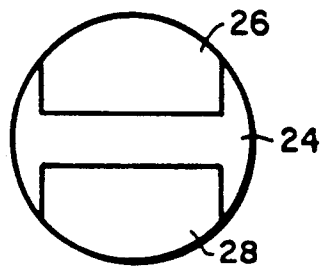
FIGS. 2A and 2B are schematic diagrams showing the useful fields available with the system described in FIG. 1.
Figure 2B:
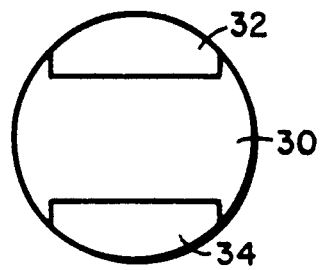

FIG. 1 illustrates an optical projection system of the type described in U.S. Pat. No. 4,391,494 including a mirror 10 and a composite achromat-prism assembly 12 which are disposed symmetrically about an optical axis 14. The reticle pattern plane 16 lies on one side of the axis 14 and the wafer image or object plane 18 lies on the opposite side. The prisms 20 and 22 couple light into and out of the optical system and separate the reticle plane 16 from the horizontal wafer plane 18. An air gap between the reticle plane 16 and the prism 20 and the wafer plane 18 and the prism 22 provides sufficient mechanical clearance and space for movement of a wafer and a reticle into and out of the respective wafer image plane 18 and reticle pattern plane 16. This system has proved quite advantageous and useful with systems of moderate to low numerical aperture. However, because of the use of the prisms 20 and 22 the system inherently includes a certain amount of field which is lost due to vignetting that is dependent on numerical aperture. Thus, FIG. 2A diagramatically illustrates that in an optical system having a relatively low numerical aperture, a relatively small portion 24 in the center of a lens field is lost due to vignetting but still leaves a relatively large reticle field 26 and wafer field 28. However, as is illustrated in FIG. 2B at relatively high numerical apertures the vignetted portion 30 increases markedly and the reticle field 32 and wafer field 34 decrease correspondingly.

Figure 4:
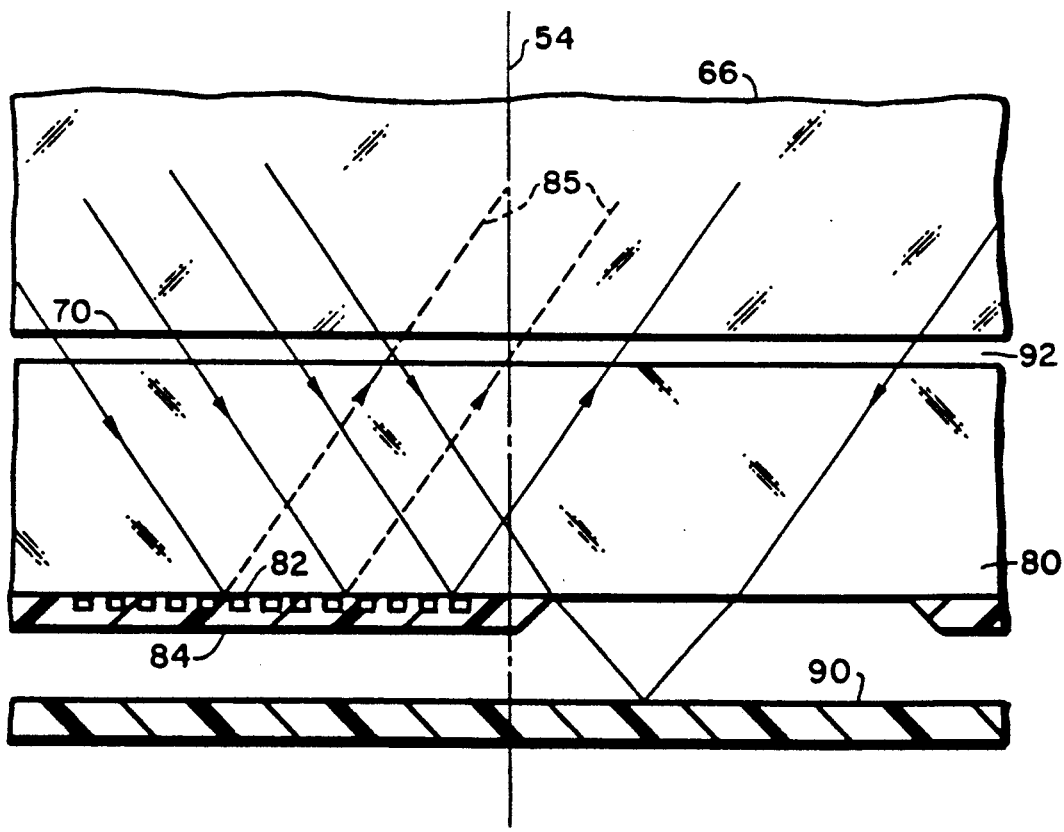
FIG. 4 is a partial schematic view of the reticle assembly used in the optical system shown in FIGS. 3A, 3B, and 3C.
Figure 3A:
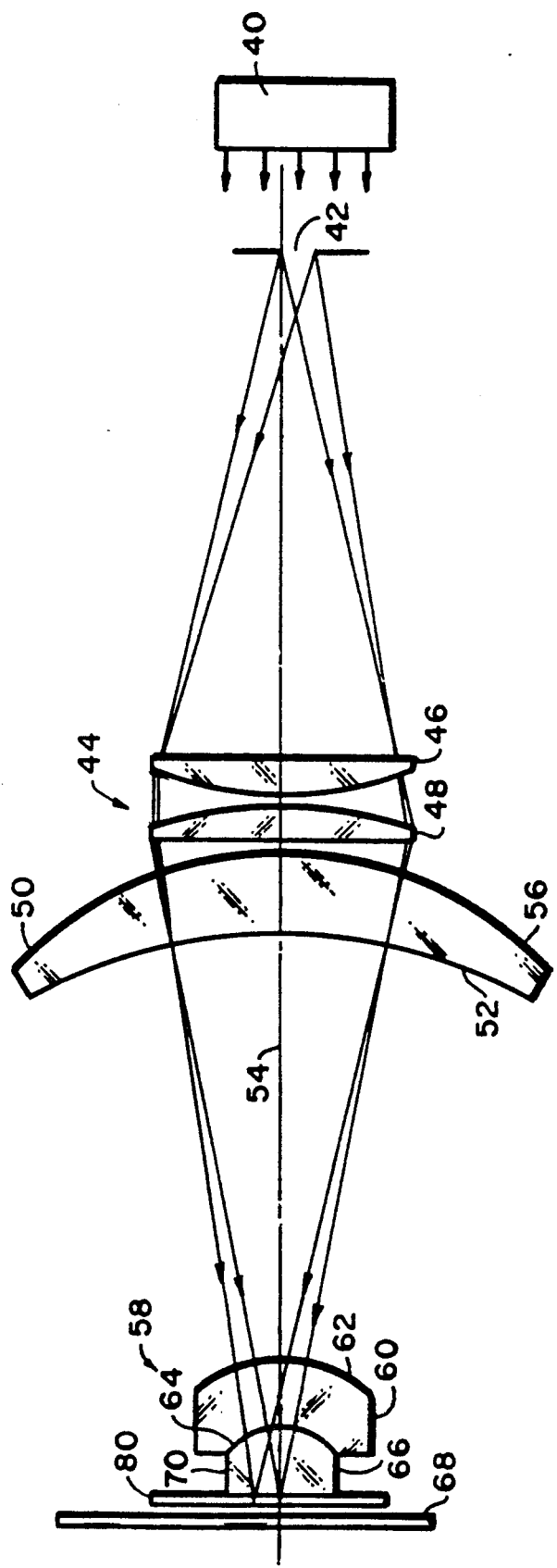
FIG. 3A is an optical schematic view of the projection and illumination relay optical system of the present invention.
Figure 3B:
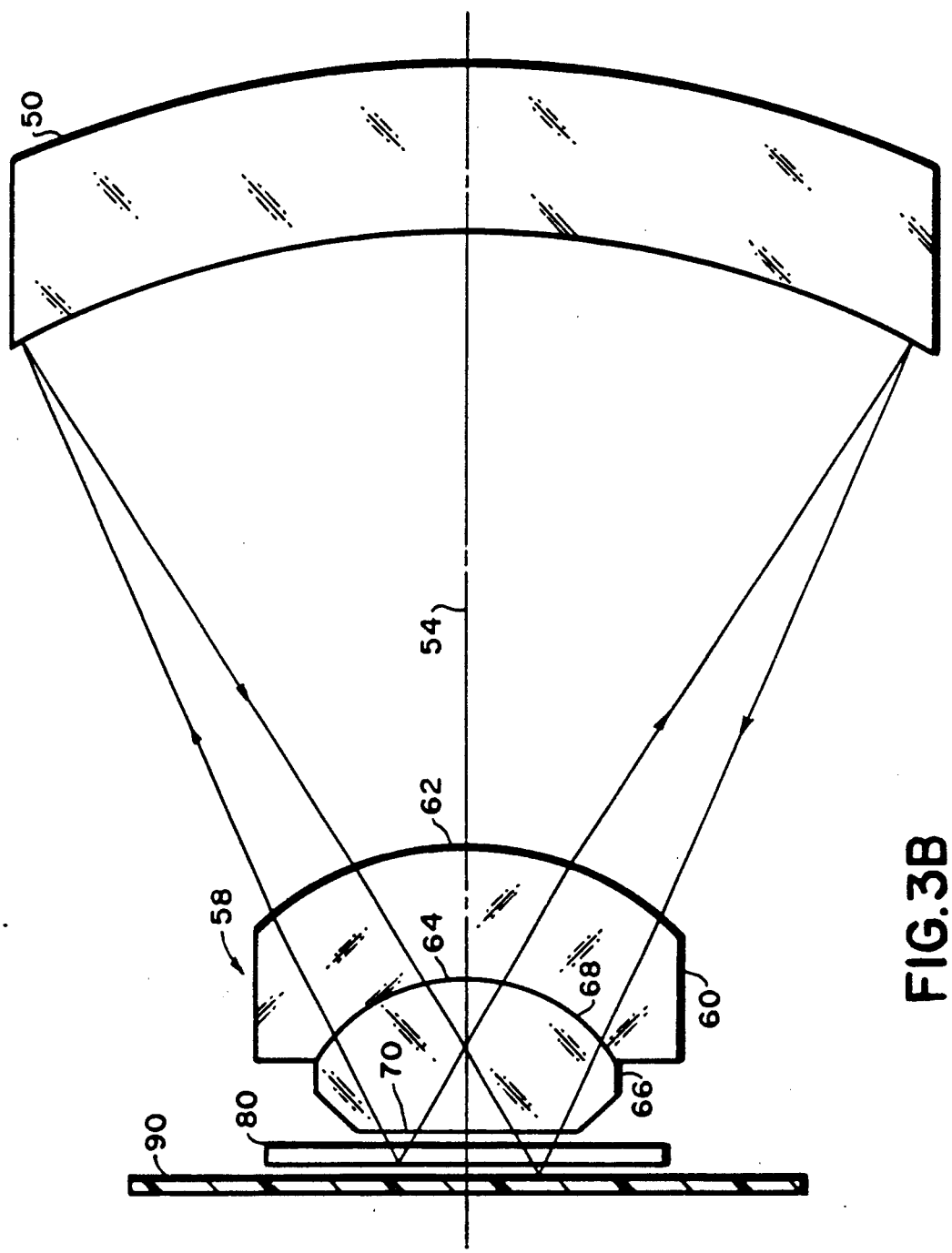
FIG. 3B is an optical schematic view of a portion of the system shown in FIG. 3A.

In order to overcome the aforementioned limitations, I have invented a projection optical and illumination relay system as illustrated in FIGS. 3A and 3B. A source of exposure energy 40 generates a beam of energy which is directed through an aperture 42 to a relay 44 which, for example, may be comprised of a plano-concave element 46 and a plano-convex element 48. The converging illumination beam is then directed through a primary meniscus lens 50 having a partially reflective surface 52. The surface 52 is preferably a dielectric coating having a reflectivity of approximately However, coatings having a reflectivity in a range of 50%. However, coatings having a reflectivity in a range of 25% to 75% are acceptable. The relay 44 and primary lens-mirror 50, 52 are symmetrically disposed about an optical axis 54. The primary lens is preferably made of fused silica and includes a first surface 56 closest to the relay 44 and the source of exposure energy 40 in addition to the partially reflective surface 52. That portion of the beam 40 which passes through the surface 52 is directed to a refractive lens assembly or group 58 for receiving and transmitting that portion of the beam of energy. The lens group 58 preferably includes at least a meniscus lens 60 made from a material having a relatively high index of refraction, for example, fused silica. The lens 60 has a first convex surface 62 facing the primary lens mirror 50 and a concave surface 64 facing away from the primary lens mirror 50. The lens group 58 further includes a plano-convex lens 66 preferably made from a material having a lower index of refraction and a lower dispersive power than the meniscus lens 60, for example, calcium fluoride and has a convex surface 68 facing the concave surface 64 and a flat or nearly flat surface 70 facing away from the primary lens-mirror 50,52. The lens group 58 is also symmetrically disposed about optical axis 54. The lens group 58 may further include additional elements as is known in the art and in particular, may include an optical block having a high index of refraction adjacent the flat surface 70 to obtain additional working space for the system. Thus, as shown in FIG. 3C, the lens group 58 may include a second thin meniscus lens made from barium fluoride and a plano-plano element 74 made from calcium fluoride in addition to the lens 60 and the plano-convex lens 66, which in this embodiment is preferably made of lithium fluoride. A reticle element 80 is positioned in close proximity to the flat surface 70 of plano-convex lens 66. As is shown more clearly in FIG. 4, the reticle element 80 has a uniform thickness and has a pattern 82 contained in a reflective film coated on the surface of the reticle furthest from the flat surface 70. The reticle pattern 82 is preferably made in a material such as aluminum having a high degree of reflectivity with respect to the optical exposure energy generated by source 40. A covering layer 84, preferably a silicone polymer, is coated over the aluminum pattern 82. The covering layer 84 primarily serves to prevent light passing through the pattern 82 from being directly imaged onto a silicon wafer 90 positioned parallel to and in close proximity to the reticle element 80. The covering layer 84 also serves to protect the pattern 82 from contaminants and provides both higher resolution and increased edge control for the pattern 82 as will be described herein. Since the pattern is protected on its other side by the body of the reticle 80 itself, the use of pellicles, common with transmissive patterns is eliminated. It should be further noted that the entire uniform thickness of the reticle serves as an integral part of the optical system. The reticle element 80 is preferably made of fused silica having a thickness of less than 0.5". The plane illuminated by the optical system shown in FIG. 3 coincides with the surface of reticle 80 on which the pattern 82 is contained. Furthermore, the field aperture 42 is positioned with respect to the optical axis 54 so that only that portion of the object plane above the axis 54 receives exposure energy.

That portion of the exposure energy falling between lines of the reflective pattern 82 is partially reflected by the covering layer 84 and subjected to a 180 degree phase shift with respect to exposure energy reflected by the pattern 82. The reason a phase shift occurs is that exposure energy travelling in a glass reticle blank will be reflected efficiently only when it encounters a material having a relatively high index of refraction such as a metal coating Since the covering layer 84 is selected to have a lower index of refraction than the reticle element 80, an approximately 180 degree phase shift between the high and low reflectivity areas is created. This phase shift combined with the low amplitude of exposure energy reflected from the low reflectivity area improves the steepness of the intensity change at each edge boundary thereby providing better line width control than has heretofore been attainable. In addition, the index of refraction difference between the reticle element 80 and the covering layer 84 is selected so that the exposure threshold of the wafer photoresist is not exceeded. That portion of the beam of exposure energy which is reflected off the pattern 82 is reflected back through the thickness of the reticle element 80 and the lens group 58 to the partially reflective coating 52 on primary lens-mirror 50. The reflected light from the coating 52 is directed back through the lens group 58, an unpatterned space on the reticle blank 80 and a space between the reticle blank 80 and the wafer 90 to form an image on the wafer 90.

The index of refraction of the covering layer 84 is preferably in the range of 7% to 14% lower than the index of refraction of the reticle element 80. Thus, for example, should the reticle element 80 be made of fused silica having an index of refraction of 1.5 for light in the deep ultraviolet range, then the covering layer 84 could be made of any one of a number of silicone polymers within the indices of refraction in the range of 1.29 to 1.40. In selecting the proper materials, one must keep in mind that the amount of reflected light from covering layer 84, illustrated by reflected rays 85 in FIG. 4, must be below the exposure threshold for the photoresist being utilized, so that no exposure of the photoresist will result from this reflected light. Thus reflective light is introduced in a region that was not present in my prior embodiment illustrated in the aforementioned Ser. No. 07/267,965. This light has a 180 degree phase shift with respect to light reflected by the pattern 82. Therefore, in the region of an edge, this phase shifted, low intensity reflective light interferes with the light reflected by the pattern 82 in the region near the edge resulting in sharper edges at the image. By introducing a small amount of negative reflected light to a region that otherwise would have no reflected light, sharper edges are produced. Sharper edges result in both better edge control and higher resolution for the resultant image.

The optical projection system shown in FIGS. 3A, 3B, and 3C is a unit magnification system which nearly completely avoids the field vignetting problem referred to in connection with the optical system described in FIG. 1. Nearly 50% of the total field may be utilized to create an image on wafer 90 and this proportion is almost completely independent of the numerical aperture of the system. The exposure energy from source 40 is designed to fill the central half of the spherical primary lens mirror 50 to thereby achieve a partial coherence of 0.5.

As will be described further in connection with FIG. 7, the space 92 between the flat surface 70 and the reticle element 80 may be filled with air, or to improve the characteristics of the system, may be filled with a fluid.

Figure 5A:
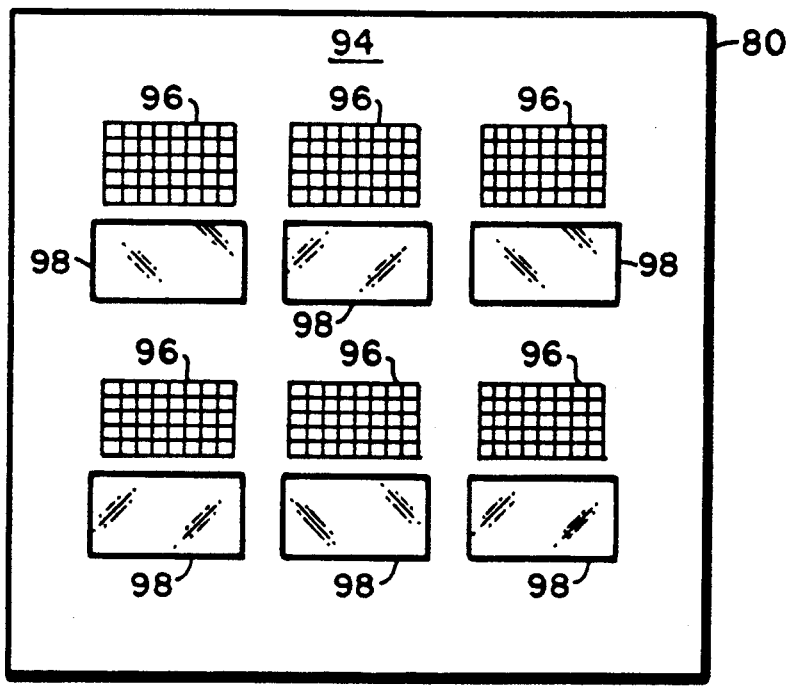
FIGS. 5A and 5B show in schematic form a typical reticle assembly layout for use with the optical system shown in FIG. 3.
Figure 5B:
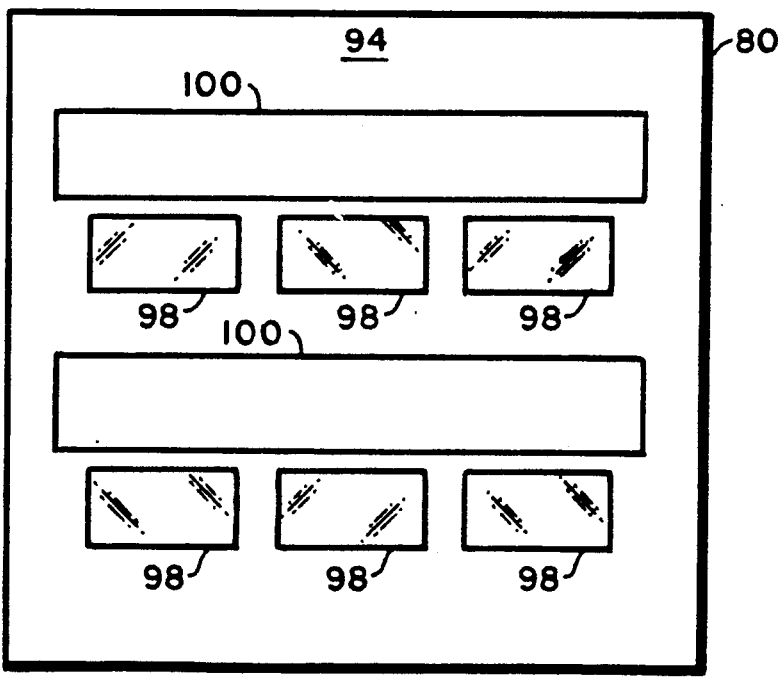

FIGS. 5A and 5B illustrate a typical format for the reticle element 80. In FIG. 5A the reticle 80 holds a patterned aluminum coating 94 and includes 6 rectangular patterned areas 96. Adjacent to each patterned area 96 is a transparent area 98 which is slightly greater than the area of its adjacent pattern 96. FIG. 5B shows the reticle 80 illustrated in FIG. 5A after a backing film such as a dyed silicone polymer 100 is applied to the patterned surface covering the patterns 96. The transparent areas 98 may be created by masking during the application of the silicone polymer backing.

FIG. 6 schematically illustrates a suitable reticle stage and wafer chuck for maintaining the reticle element 80 in a movable relationship with respect to the flat surface 70 of the plano-convex lens 66 and parallel to that flat surface. This is accomplished by mounting the projection optical system lens group 58 in a support 122 affixed to the system housing. The reticle stage 124 is magnetically held against the support or frame 122 and includes means for clamping the reticle 80 therein. The reticle stage 124 further includes air bearings (not shown) to permit it to float against the frame 122 so that when movement of the reticle 80 is desired, the air bearings are activated to overcome the magnetic attraction holding the reticle stage 124 in place against the support 122, which is preferably made of steel. The wafer 90 is affixed to a wafer chuck 126 which is mounted on a motor actuated wafer stage 128. The stage 128 is in turn connected by retractable fingers 130 to reticle stage 124. Thus, when it is desired to move reticle 180, the air bearings on the reticle stage 124 are activated, the fingers 130 are activated to couple reticle stage 124 to wafer stage 128 and the reticle stage 124, the wafer chuck 126, and the stage 128 are moved together. Once the reticle stage is positioned at its desired location, the fingers 130 are retracted, uncoupling the reticle stage 124 from the wafer stage 128 and the air bearings on reticle stage 124 are deactivated to magnetically clamp the reticle stage in place against support 122. Stage 128 is then free to position wafer chuck 126 independently of reticle stage 124 to thereby position the wafer 90 in its desired location with respect to reticle 80. This design has the advantage of permitting the reticle to be moved in two dimensions. As has been previously mentioned, the gap between the reticle 80 and the lens system 120 could be filled with an optical coupling fluid such as silicone oil to eliminate the air gap between the reticle 80 and the lens system contained in housing 120. With this arrangement the wafer 90 can be positioned in a parallel relationship to the reticle 80 but spaced therefrom by a small air gap. Since the object and image planes are not quite coplanar in the projection system of the present invention, this means that a slight asymmetry is created, which has a negligible effect on image quality. Another relatively minor disadvantage of the optical system described in FIG. 3 is that the partially reflecting mirror surface used once in transmission and once in reflection causes slightly more than 75% of the exposure energy from the source 40 to be wasted.

However, the advantages of the system far outweigh these minor disadvantages and thus it can be readily seen that a unit magnification optical projection system particularly suited for use in microlithography has been provided which is capable of producing a large field size at high numerical apertures. Furthermore the proportional usable field size is independent of the numerical aperture of the system. Because of the reflective reticle used in the system, there is no need for pellicles to protect the reticle from contaminants. The covering for the reticle pattern provides improved edge control and resolution. Finally, the projection system of the present invention is quite simple and relatively inexpensive to manufacture.

While there has been described what is at the present considered to be the preferred embodiment of the present invention, it will be obvious to those skilled in the art that various changes and modifications may be made therein, without departing from the invention, and it is, therefore, aimed in the appended claims to cover all such changes and modifications as fall within the true spirit and scope of the present invention.

What is claimed is:

1. A reticle for use in an optical projection system comprising:

a transparent element having a first index of refraction and having a predetermined uniform thickness and surfaces separated by said thickness;

a reticle pattern on one of said surfaces made from a material having a high degree of reflectivity with respect to optical exposure energy; and means physically contacting said reticle pattern for completely covering said reticle pattern, said covering means having a high degree of absorption with respect to optical exposure energy and a second index of refraction, said second index of refraction being lower than said first index of refraction.

2. A reticle as defined in claim 1 wherein said second index of refraction is in the range of 7 to 14% lower than said first index of refraction.

3. A reticle as defined in claim 2 wherein said first index of refraction is approximately 1.5 and said second index of refraction is in the range of 1.29 to 1.40.

4. A reticle as defined in claim 1, wherein said reticle pattern is aluminum, said transparent element is fused silica having a thickness of less than 0.5 inches, and said covering means is a silicone polymer.

5. A reticle as defined in claim 1 including a plurality of patterns each having a predetermined external dimension and a corresponding plurality of transparent spaces adjacent each pattern with the dimensions of each space being equal to or greater than the dimensions of its adjacent pattern in all respects.

6. A photolithographic projection optical system comprising:

a source of exposure energy for generating a beam of energy;

an optical element located in the path of said beam for receiving said beam of energy and passing only a portion of said beam therethrough;

a refractive lens group located in the path of said portion of said beam for receiving and transmitting said portion of said beam of energy;

a reticle element located in the path of said portion of said beam, said reticle element including a transparent portion having a uniform thickness and having a pattern on one surface thereof, and an unpatterned portion adjacent thereto, said pattern being made from a material having a high degree of reflectivity with respect to optical exposure energy for reflecting said portion of said beam striking said pattern at a first intensity level and means completely covering said pattern for reflecting and changing the phase of said portion of said beam striking said covering means at a second intensity level significantly lower than said first intensity level, said reticle element being positioned for permitting said portion of said beam to pass through said thickness and for reflecting said portion of said beam through said thickness, and said lens group to said optical element;

said optical element receiving said reflected beams and including means for reflecting a portion of said reflected beams back through said lens group and said unpatterned portion of said reticle element to a surface to be imaged.

7. An optical system as defined in claim 6 wherein said transparent portion of said reticle element has a first index of refraction and wherein said covering means has a second index of refraction, said second index of refraction being lower than said first index of refraction.

8. An optical system as defined in claim 7 wherein said second index of refraction is in the range of 7 to 14% lower than said first index of refraction.

9. An optical system as defined in claim 8 wherein said first index of refraction is approximately 1.5 and said second index of refraction is in the range of 1.29 to 1.40.

10. An optical system as defined in claim 6 wherein said reticle pattern is aluminum, said transparent element is fused silica having a thickness of less than 0.5 inches, and said covering means is a silicone polymer.

11. A optical system as defined in claim 6 including a plurality of patterns each having a predetermined external dimension and a corresponding plurality of transparent spaces adjacent each pattern with the dimensions of each space being equal to or greater than the dimensions of its adjacent pattern in all respects.

12. A photolithographic projection optical system including:

a source of exposure energy for generating a beam of energy;

a lens assembly for receiving and transmitting energy beams from said energy source, said lens assembly having a reticle on an end thereof farthest from said energy source and located in the path of said beam of energy, said reticle having a pattern thereon on a surface farthest from said energy source and an unpatterned portion adjacent thereto, said reticle being positioned for receiving said energy beam through said lens assembly and reflecting said pattern back through said reticle and said lens assembly, said reticle element including a transparent portion having a uniform thickness and having a pattern on one surface thereof, and an unpatterned portion adjacent thereto, said pattern being made from a material having a high degree of reflectivity with respect to optical exposure energy for reflecting said beam striking said pattern at a first intensity level and means completely covering said pattern for reflecting and changing the phase of said beam striking said covering means at a second intensity level significantly lower than said level, said recticle element being positioned for permitting said beam to pass through said thickness and for reflecting said beams at said first and second intensity levels through said thickness, and said lens assembly;

a mirror for receiving said reflected beams from said lens assembly and reflecting said beams back through said lens assembly and said unpatterned portion of said reticle onto a surface to be imaged.

* * * * *

UNITED STATES PATENT AND TRADEMARK OFFICE
CERTIFICATE OF CORRECTION

PATENT NO. : 5,040,882
DATED : August 20, 1991
INVENTOR(S) : David A. Markle

It is certified that error appears in the above-indentified patent and that said Letters Patent is hereby corrected as shown below:

Column 3, line 52, delete "However, coatings having a reflectivity in a range of".

Column 5, line 49, replace "7" with --4--.

Column 8, line 49, after "than said" insert --first intensity--.

Signed and Sealed this

Third Day of October, 1995

Attest:

BRUCE LEHMAN

Attesting Officer     Commissioner of Patents and Trademarks